United States Patent [19]
Chan et al.

[11] Patent Number: 5,235,300
[45] Date of Patent: Aug. 10, 1993

[54] MILLIMETER MODULE PACKAGE

[75] Inventors: Steven S. Chan, Alhambra; D. Ian Stones, Torrance, both of Calif.

[73] Assignee: TRW Inc., Redondo Beach, Calif.

[21] Appl. No.: 852,615

[22] Filed: Mar. 16, 1992

[51] Int. Cl.5 .................. H01P 5/00; H01L 23/12
[52] U.S. Cl. .................. 333/247; 333/26; 257/728
[58] Field of Search .............. 333/26, 246, 247; 357/74; 257/728

[56] References Cited

U.S. PATENT DOCUMENTS

| | | | |
|---|---|---|---|
| 4,453,142 | 6/1984 | Murphy | 333/26 |
| 4,550,296 | 10/1985 | Ehrlinger et al. | 333/26 |
| 4,841,353 | 6/1989 | Wada et al. | 333/247 X |
| 4,901,041 | 2/1990 | Pengelly | 357/74 X |
| 4,933,745 | 6/1990 | O'Shea et al. | 333/247 X |
| 4,953,001 | 8/1990 | Kaiser, Jr. et al. | 357/74 |
| 4,999,592 | 3/1991 | Kanda et al. | 333/26 |
| 5,045,820 | 9/1991 | Leicht et al. | 333/26 |

*Primary Examiner*—Paul Gensler
*Attorney, Agent, or Firm*—Ronald L. Taylor

[57] ABSTRACT

A module package for unpackaged millimeter wave or microwave devices allows the device to be dropped into a cavity formed in a housing and then hermetically sealed therein. Employing dielectric probe members which pass through corresponding slots in the housing to electrically interconnect the device within an application circuit allow for effective hermetic sealing and minimize electrical discontinuities and transmission losses.

16 Claims, 2 Drawing Sheets

MILLIMETER MODULE PACKAGE

BACKGROUND OF THE INVENTION

1. Technical Field

The present invention relates generally to electronic packaging technology and, more particularly, to a modular package for housing unpackaged millimeter wave and microwave devices.

2. Discussion

Unpackaged millimeter wave or microwave devices, or integrated circuits such as Gallium Arsenide (GaAs) MIMIC chips, are those without their associated interconnections, terminations and heat sinks commonly included with standard prepackaged devices. Present technology for housing these devices for interconnection into various application circuits involves the placement of such devices inside hermetically sealed packages. Metallic probes, typically in the form of metal wires, are commonly used to interconnect the unpackaged device, sealed inside the package, to the remainder of the application circuit. Since these devices operate in microwave frequencies, square channel waveguides are often connected to the outside of the package, surrounding the protruding wires, to capture RF signals. These signals are then transmitted through the wire to a separate interface to the chip inside the package. The metallic wires pass through oversized openings in the walls of the package and glass beads are typically employed to seal the wires within the openings.

There are numerous disadvantages to such a configuration, however, the first being the number of separate parts necessary. Also, it is difficult to hermetically seal the probe within the package wall in order to effectively hermetically seal the chip within the package. The glass beads tend to crack under pressure, making such packaging useless. Also, the glass beads employed in packages of this type are difficult to manufacture due to a large number of variations or defects possible therein including surface and subsurface bubbles, cracks, chip outs, improper glass climb and glass overflow and underflow. These packages also have limited electrical performance due to high VSWR and transmission losses.

There is, therefore, a need for a hermetically sealable package for unpackaged millimeter wave and microwave devices which is reliable and simple to manufacture. This package should minimize mechanical interconnection as well as volume, weight and cost. The probe employed should also be designed to minimize electrical discontinuities and resulting VSWR and transmission losses.

SUMMARY OF THE INVENTION

The unique package for housing unpackaged millimeter wave or microwave devices according to the teachings of the present invention allows these unpackaged devices to be dropped into a cavity formed in a housing and to be effectively hermetically sealed therein. By employing a pair of dielectric probe members, which pass through corresponding slots in the housing and which are easily hermetically sealable therein, problems experienced with glass beads have been substantially eliminated. The packages are modular making them readily interconnectable and a unique integrated RF probe transition concept provides enhanced electrical integrity at a reduced cost.

Additional objects, advantages and features of the present invention will become apparent from the following description and amended claims, taken in conjunction with the accompanying drawings.

DETAILED DESCRIPTION OF A PREFERRED EMBODIMENT

Figure 1:
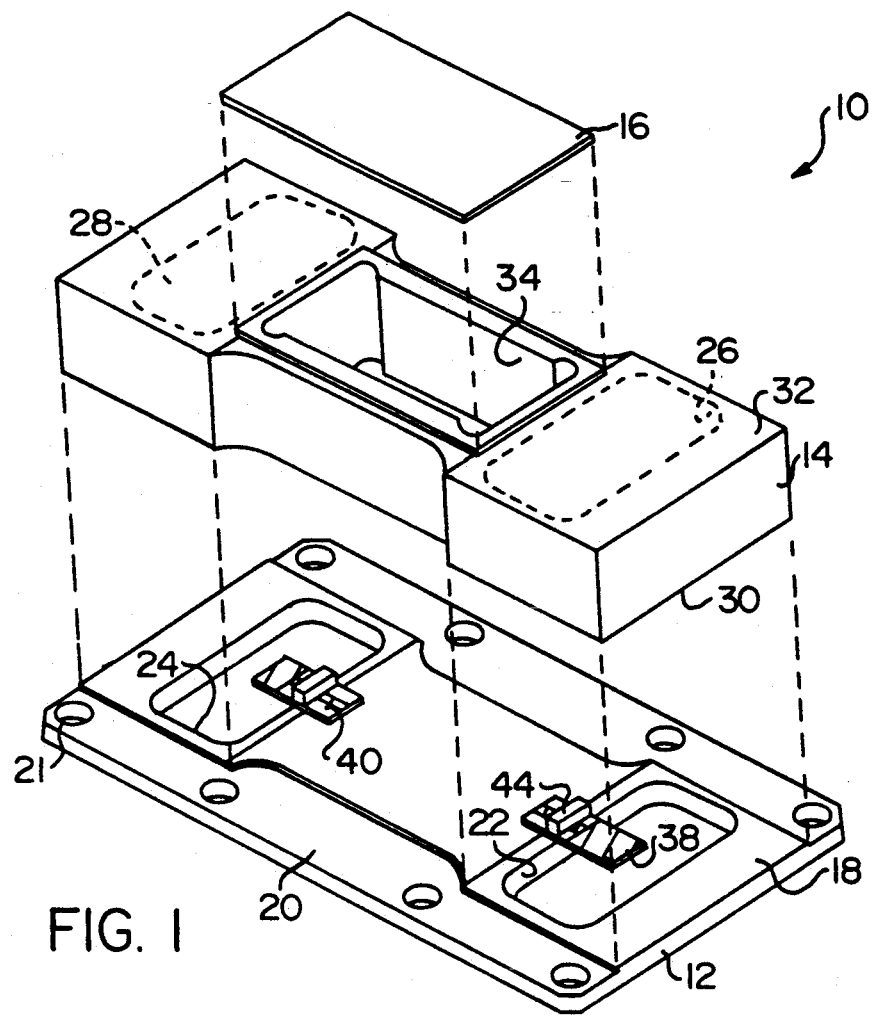
FIG. 1 is a exploded perspective view of the millimeter package according to the teachings of the present invention.

A millimeter module package according to the teachings of the present invention is shown generally at 10 in FIG. 1. The package 10 consists of three main portions, a base portion 12, a body portion 14 and a package cover 16, which in combination form a housing for the device. The base 12 and body 14 are preferably integrally formed but are shown as separate pieces in FIG. 1 for purposes of clarity. Base 12 has mainly two sections, a raised section 18 and a mounting flange 20 as seen best in FIG. 2. The mounting flange 20 optionally has a plurality of holes 21 or other similar mounting features formed therein, useful for mounting the package 10 for integration with other application circuit elements.

Base 12 is preferably formed of a conducting metallic material and is substantially rectangular in shape, having two substantially rectangular waveguide openings 22 and 24 formed therethrough. Body portion 14, also preferably made of the same conducting metallic material, has a pair of substantially rectangular apertures 26 and 28 formed therein. Apertures 26 and 28 are aligned in body 14 such that their outer peripheries substantially correspond with openings 22 and 24, respectively, in base 12. Apertures 26 and 28 extend partially through body 14 from a bottom side 30 but do not extend through to a top side 32, thereby basically creating a pair of hollow indentations in the housing.

Intermediate apertures 26 and 28 in body 14 is a third aperture 34 which is also substantially rectangular and which does extend through both top side 32 and bottom side 30 of body 14. The placement of body portion 14 onto base 12 results in an interior cavity defined substantially by aperture 34. Attachable atop aperture 34 is package cover 16, which is sufficient in size and shaped so as to completely cover aperture 34.

The unpackaged device 36, such as a GaAs MIMIC chip or alternately multiple chips or integrated circuits, is placed atop base 12 between apertures 22 and 24 and within the cavity substantially defined by aperture 34. Also placed atop base 12, on opposing sides of device 36 and extending partially into openings 22 and 24, are probe members 38 and 40, respectively. A close-up detailed view of probe member 38 is provided in FIG. 3.

Probe 38 basically includes a base portion 42 and a raised portion 44. Both are preferably formed from a dielectric material such as a ceramic. An electrically conductive path, preferably in the form of a microstrip line 46, is disposed on a top surface of base portion 42 as is a conductive area which forms a microwave probe region 48. The microstrip line 46 and probe region 48 are preferably a metallic material deposited on said base portion 42 by a photolithographic or other such process known in the art. The microstrip line extends beneath raised portion 44 and slightly therebeyond to microwave probe region 48. Raised portion 44 is joined to base portion 42, sandwiching microstrip line 46 therebetween, by a co-fired ceramic process and/or a transfer tape process to form a strip line and creating a microstrip to strip line to microwave probe transition unique to the probe members 38 and 40 of the present invention.

Figure 2:
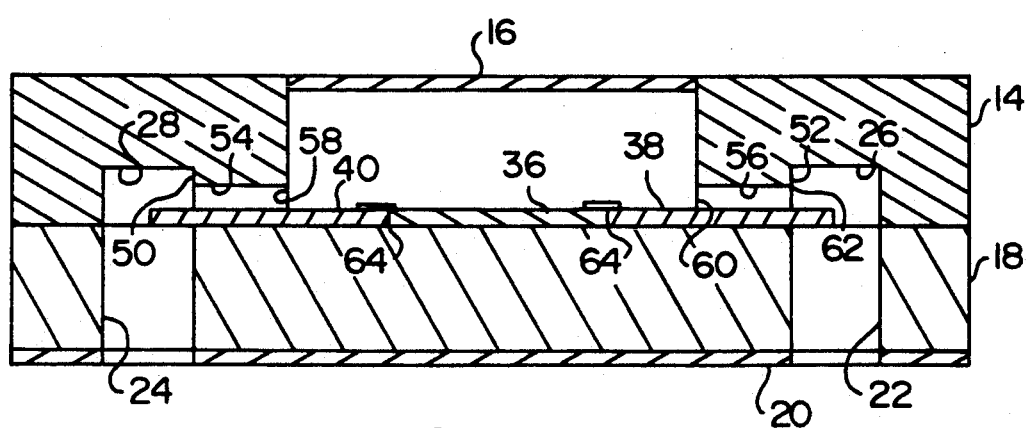
FIG. 2 is a cross-sectional view taken generally through the longitudinal center line of the package shown in FIG. 1.
Figure 3:
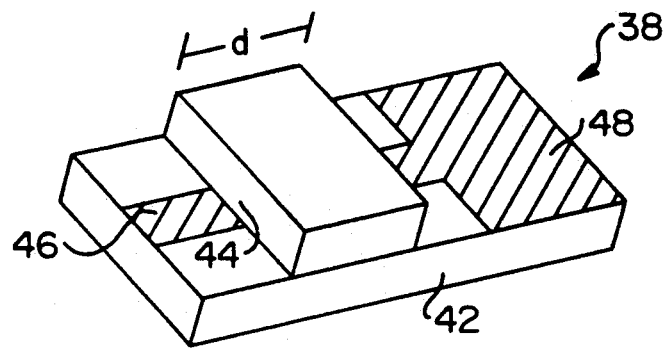
FIG. 3 is a detailed perspective view of the probe.
Figure 4:
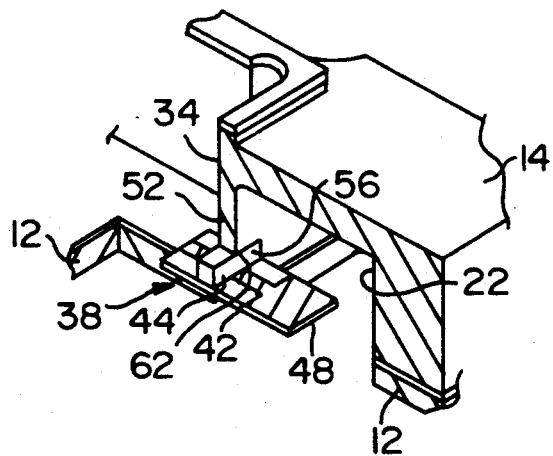
FIG. 4 is a partial cross-sectional view of the module package illustrating the integration of the probe shown in FIG. 3 within the housing.

The body portion 14 has formed through partitions 50 and 52, intermediate apertures 34 and 28 and intermediate apertures 34 and 26, a pair of rectangular notches 54 and 56 as shown best in FIGS. 2 and 4. When the present package 10 is assembled or integrally formed with body 14 atop base 12, notches 54 and 56 form, in combination with base 12, slots 58 and 60 in the housing. Probe member 40 passes through slot 58 and probe member 38 passes through slot 60. As shown in FIG. 4, slot 60 is preferably sized so as to correspond with the outside dimensions of the raised portion 44 of the probe 38 together with base portion 42 as shown in FIG. 4. Also, preferably the thickness of the partition 52 of the body portion 14 formed between apertures 34 and 22 is the same as the dimension d of raised portion 44 as shown in FIG. 3. This allows for an effective hermetic seal 62 to be created between slot 60 and probe member 38. This hermetic sealing is preferably effected by brazing probe member 38 into slot 60. The same is true with respect to probe 40 on the opposite side. The unpackaged device 36 can be placed into aperture 34 and cover 16 then attached to the body 14, such as by soldering or welding, so as to completely cover and hermetically seal aperture 34. The metallic base 12 and body 14 act as a heat sink for the chip. The hollow indentations formed by apertures 22 and 24 act as waveguides channelling RF signals to and from the microwave probe portions 48. Millimeter or microwave signals received by probe portions 48 are electrically transmitted through the microwave probe to strip line to microstrip line transition and then through a low inductance metallic ribbon bond 64, preferably disposed between the device 36 and probe 38 and approximately sized to match the transmission line 46, to the unpackaged chip 36. A responsive signal generated by chip 36 is electrically transmitted through a second metallic ribbon bond 64, along the microstrip line 46 to the opposite strip line out through the housing, and then is transmitted by the microwave probe through the opposite waveguide.

This unique probe transition provides superior electrical performance and is able to handle increased frequency ranges and power densities. Electrical discontinuities are minimized and consequently so are VSWR and transmission losses. Also, a reduced number of parts reduces costs and the dielectric or ceramic probe eliminates cracking and other problems experienced with glass beads, thereby improving reliability.

The foregoing discussion discloses and describes merely exemplary embodiments of the present invention. One skilled in the art will readily recognize from such discussion, and from the accompanying claims, that various changes and modifications can be made therein without departing from the spirit and scope of the invention as defined in the following claims.

What is claimed is:

1. A module package for at least one unpackaged integrated circuit chip comprising:
   a housing having an interior cavity formed therein and a pair of slots formed therethrough, said chip being disposed within said cavity;
   a pair of probe members, each probe member being formed of a dielectric substrate having an electrically conductive path disposed thereon, each said probe member having a first end and a second end, said first ends each being disposed within said cavity;
   means for electrically connecting each said conductive path to said chip; and
   waveguide means in said housing for directing microwave or millimeter wave signals, said probe members intermediate said first and second ends each passing through one of said slots in said housing so as to extend from said cavity into said waveguide means, said probe members each forming a microstrip to stripline to microwave probe transition.

2. The package of claim 1 wherein each said means for electrically connecting comprises a metallic ribbon disposed between said probe member and said chip.

3. The package of claim 1 wherein said waveguide means is integrally formed with said housing.

4. The package of claim 1 wherein said waveguide means comprises a pair of hollow indentations in said housing, each disposed on an opposite side of said cavity.

5. The package of claim 1 wherein said housing further comprises a separately attachable cover, said cover being hermetically sealable onto said housing.

6. The package of claim 5 wherein said housing and said cover comprise a metallic material and wherein said cover is soldered or welded to said housing.

7. The package of claim 1 wherein said probe members are hermetically sealed in said slots.

8. A module package for at least one unpackaged integrated circuit chip comprising:
   a housing having an interior cavity formed therein and a pair of slots formed therethrough, said chip being disposed within said cavity;
   a pair of probe members, each probe member being formed of a dielectric substrate having a first end and a second end, said first ends each being disposed within said cavity, said probe members intermediate said first and second ends each passing through one of said slots in said housing, each of said probe members comprising a base portion and a raised portion, said raised portion being smaller in size than said base portion and disposed on said base portion intermediate said first and second ends; and
   an electrically conductive path disposed on each said probe member.

9. The package of claim 8 wherein said base portion of each said probe member has a said electrically conductive path disposed thereon, said conductive path passing between said base and raised portions.

10. The package of claim 9 wherein said electrically conductive path is deposited on said base portion.

11. The package of claim 8 wherein said base and raised portions are formed of a ceramic.

12. The package of claim 10 wherein said electrically conductive path on each said probe member forms a microstrip to strip line to microwave probe transition.

13. A method for packaging at least one unpackaged integrated circuit chip comprising the steps of:

providing a housing having an interior cavity formed therein and a pair of slots formed therethrough;

providing a waveguide means in said housing for directing microwave or millimeter wave signals;

providing a pair of dielectric probe members such that a first end of each said probe member is disposed within said cavity and a second end of each said probe member protrudes from said housing cavity into said waveguide means, each of said probe members intermediate said first and second ends passing through one of said slots in said housing;

providing an electrically conductive path on each said probe member so as to form a microstrip to stripline to microwave probe transistion; and depositing said chip into said cavity and electrically coupling said chip to said conductive paths.

14. The package of claim 13 wherein said housing is formed of a conductive material and said probe members are brazed into said slots.

15. The method of claim 13 further comprising the steps of attaching a cover to said housing to cover said cavity; and hermetically sealing said cover to said housing.

16. The method of claim 15 further comprising the step of hermetically sealing each of said probe members into said slots to effect hermetic sealing of said chip within said housing.

* * * * *